United States Patent
Huh et al.

(10) Patent No.: US 8,202,758 B2
(45) Date of Patent: Jun. 19, 2012

(54) THIN FILM TRANSISTOR ARRAY PANEL AND METHOD OF MANUFACTURING THE SAME

(75) Inventors: Jong-Moo Huh, Hwasung-si (KR); Seung-Kyu Park, Hwaseong-si (KR); Tae-Youn Kim, Ulsan (KR)

(73) Assignee: Samsung Electronics Co., Ltd. (KR)

( * ) Notice: Subject to any disclaimer, the term of this patent is extended or adjusted under 35 U.S.C. 154(b) by 82 days.

(21) Appl. No.: 12/817,510

(22) Filed: Jun. 17, 2010

(65) Prior Publication Data

US 2010/0255620 A1    Oct. 7, 2010

Related U.S. Application Data

(62) Division of application No. 11/563,991, filed on Nov. 28, 2006, now Pat. No. 7,763,890.

(30) Foreign Application Priority Data

Dec. 8, 2005  (KR) .................. 10-2005-0119417

(51) Int. Cl.
*H01L 51/40* (2006.01)

(52) U.S. Cl. ........................................................ 438/99
(58) Field of Classification Search ................... 438/99
See application file for complete search history.

(56) References Cited

U.S. PATENT DOCUMENTS

| | | | |
|---|---|---|---|
| 6,100,954 A | 8/2000 | Kim et al. | |
| 2003/0136971 A1 | 7/2003 | Rhee et al. | |
| 2004/0113149 A1 | 6/2004 | Kim | |
| 2004/0195959 A1 | 10/2004 | Park et al. | |

FOREIGN PATENT DOCUMENTS

| | | |
|---|---|---|
| KR | 1019990046833 | 7/1999 |
| KR | 1020040080793 | 9/2004 |
| KR | 1020050042596 | 5/2005 |

*Primary Examiner* — Anthony Ho
(74) *Attorney, Agent, or Firm* — Cantor Colburn LLP

(57) ABSTRACT

The present invention provides a thin film transistor array panel which includes a substrate, gate lines formed on the substrate, polycrystalline semiconductors formed on the gate lines, data lines formed on the polycrystalline semiconductors and including first electrodes, second electrodes formed on the polycrystalline semiconductors and facing the first electrodes, and pixel electrodes connected to the second electrodes.

9 Claims, 30 Drawing Sheets

THIN FILM TRANSISTOR ARRAY PANEL AND METHOD OF MANUFACTURING THE SAME

CROSS REFERENCE TO RELATED APPLICATIONS

This application is a divisional of U.S. patent application Ser. No. 11/563,991, filed on Nov. 28, 2006, which claims priority to Korean Patent Application No. 10-2005-0119417, filed on Dec. 8, 2005, and all the benefits accruing therefrom under 35 U.S.C. §119, the contents of which in its entirety are herein incorporated by reference.

BACKGROUND OF THE INVENTION (a) Field of the Invention

The present invention relates to a thin film transistor array panel and a method of manufacturing the same.

(b) Description of the Related Art

A flat panel display, such as a liquid crystal display ("LCD"), an organic light emitting diode ("OLED") display and an electrophoretic display, generally includes a plurality of pairs of field generating electrodes and an electro-optical active layer interposed between the field generating electrodes.

In general, one of a pair of field generating electrodes is connected to a switching element so as to be applied with electrical signals, and an electro-optical active layer converts the electrical signals into optical signals to display an image.

An LCD includes a liquid crystal layer as the electro-optical active layer, and OLED display includes an organic light emitting layer as an electro-optical active layer.

A flat panel display includes thin film transistors ("TFTs") being three-terminal switching elements, gate lines transmitting scanning signals for controlling the thin film transistors, and data lines transmitting signals to be applied to pixel electrodes.

Each TFT includes a thin film formed of an amorphous semiconductor or a polycrystalline semiconductor.

The amorphous semiconductor thin film can be applied to a display device which has a substrate formed of glass having a low melting point or plastic, since the amorphous semiconductor thin film can be formed at a low temperature. However, an amorphous semiconductor thin film has low field effect mobility, which hinders the TFT from increasing its operation speed. Further, a photo leakage of an amorphous semiconductor thin film current is high, which causes unstable characteristics of the TFT.

On the contrary, the polycrystalline semiconductor thin film has high field effect mobility and optical stability.

Meanwhile, forming the polycrystalline semiconductor thin film requires a process of crystallizing a semiconductor on a substrate. In this respect, a top gate structure is used. In this case, however, the structure of the TFT and the process thereof become complex, and manufacturing cost is significantly increased.

BRIEF SUMMARY OF THE INVENTION

The present invention has been made in an effort to provide a thin film transistor array panel and a method of manufacturing the same, having advantages of improving field effect mobility and optical stability, and simplifying manufacturing processes for the same.

An exemplary embodiment of the prevent invention provides a thin film transistor array panel which includes a substrate, gate lines formed on the substrate, polycrystalline semiconductors formed on the gate lines, data lines formed on the polycrystalline semiconductors and including first electrodes, second electrodes formed on the polycrystalline semiconductors and facing the first electrodes, and pixel electrodes connected to the second electrodes.

The thin film transistor array panel may further include ohmic contacts between the polycrystalline semiconductor and the first and second electrodes.

The ohmic contact may be an amorphous semiconductor doped with an impurity.

The ohmic contact may be a polycrystalline semiconductor doped with an impurity.

The thin film transistor array panel may further include an assistant layer formed on the polycrystalline semiconductor.

The assistant layer may include an amorphous semiconductor.

Another exemplary embodiment of the present invention provides a thin film transistor array panel which includes a substrate, gate lines formed on the substrate and including gate electrodes, data lines insulated from the gate lines and crossing the gate lines, first electrodes connected to the data lines, second electrodes facing the first electrodes, pixel electrodes connected to the second electrodes, a first semiconductor layer partially overlapping the first and second electrodes and including a polycrystalline semiconductor, and a second semiconductor layer formed on the first semiconductor layer and including an amorphous semiconductor. Further, the second semiconductor layer includes a first portion and a second portion having a smaller thickness than the first portion.

The second portion may be located between the first electrode and the second electrode.

The thin film transistor array panel may further include ohmic contacts formed between the second semiconductor layer and the first electrode and the second electrode.

Yet another exemplary embodiment of the present invention provides a thin film transistor array panel which includes a substrate, gate lines formed on the substrate and including gate electrodes, semiconductors formed on the gate lines, data lines formed on the semiconductors and including first electrodes, second electrodes facing the first electrodes on the semiconductors, and pixel electrodes connected to the second electrodes. Further, the semiconductor includes first and second layers, each of which has a different impurity concentration.

The first layer may have a smaller amount of impurity than the second layer.

The first layer may be a polycrystalline semiconductor.

Yet still another exemplary embodiment of the present invention provides a method of manufacturing a thin film transistor array panel. The method includes forming gate lines on a substrate, forming a gate insulating layer and a first amorphous semiconductor on the gate lines, crystallizing the first amorphous semiconductor so as to form a polycrystalline semiconductor, forming data lines including first electrodes and second electrodes on the polycrystalline semiconductor, and forming pixel electrodes on the second electrodes.

The method may further include forming ohmic contacts, after forming the polycrystalline semiconductor.

The method may further include etching the ohmic contacts using the data lines and the second electrodes as a mask, after forming the data lines and the second electrodes.

The method may further include forming an ohmic contact, and patterning the first amorphous semiconductor and the ohmic contact after forming the first amorphous semiconductor.

In the crystallizing of the first amorphous semiconductor, the ohmic contact may be crystallized together with the first amorphous semiconductor.

In the patterning of the first amorphous semiconductor and the ohmic contact, photosensitive patterns having different thicknesses may be used.

The method may further include forming the second amorphous semiconductor, after forming the polycrystalline semiconductor.

A further exemplary embodiment of the present invention provides a method of manufacturing a thin film transistor array panel. The method includes forming gate lines on a substrate, forming a gate insulating layer and semiconductors containing an impurity on the gate lines, forming a first semiconductor layer including a polycrystalline semiconductor and a second semiconductor layer containing an impurity by performing a heat treatment on the semiconductors containing the impurity, forming data lines including first electrodes and second electrodes on the second semiconductor layer, and forming pixel electrodes on the second electrode.

BRIEF DESCRIPTION OF THE DRAWINGS

The above and/or other aspects, features and advantages of the present invention will become apparent and more readily appreciated from the following description of the exemplary embodiments, taken in conjunction with the accompanying drawings of which.

DETAILED DESCRIPTION OF THE INVENTION

Figure 1:
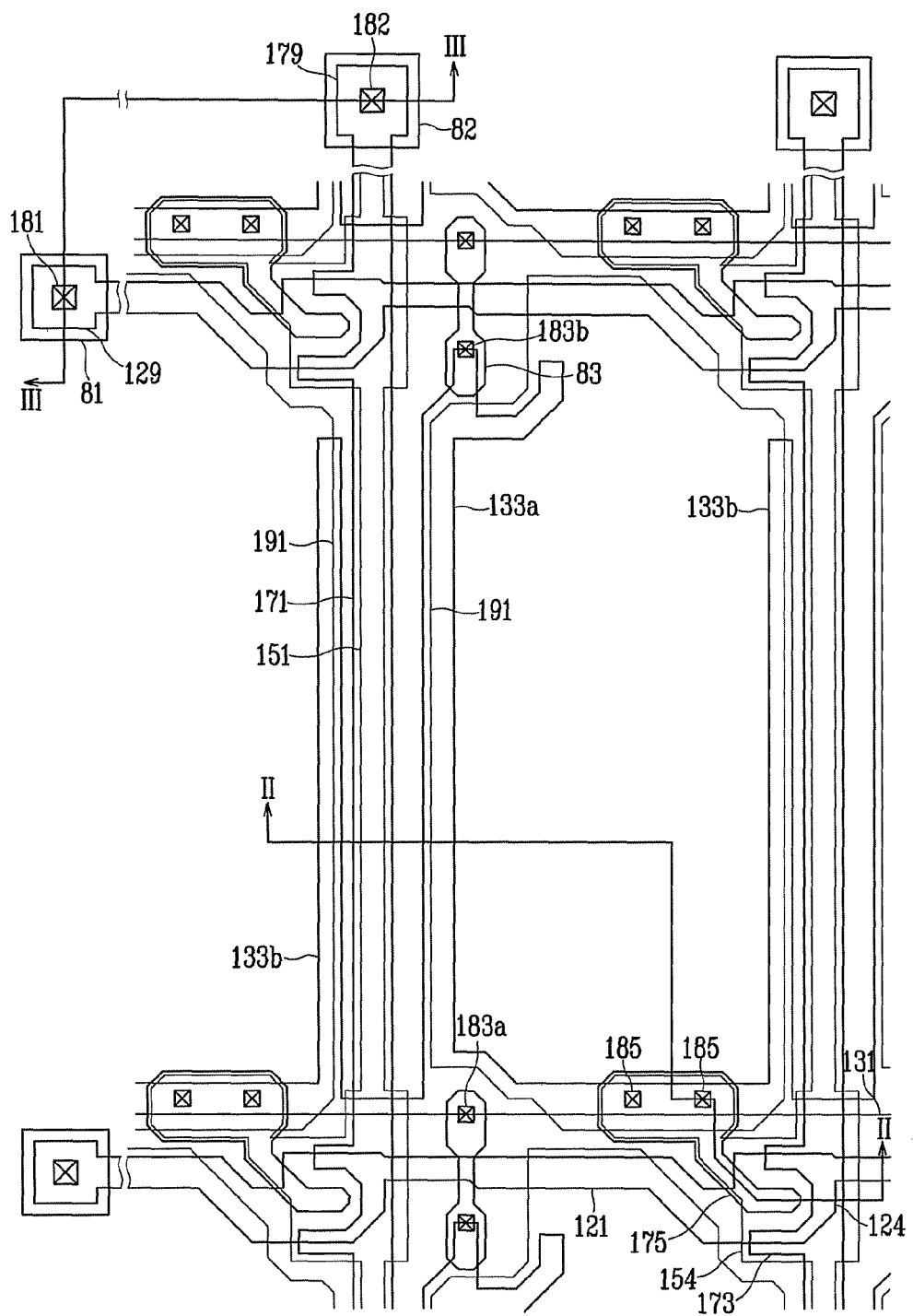
FIG. 1 is a plan view layout of a thin film transistor array panel according to an exemplary embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in more detail with reference to the accompanying drawings.

[First Embodiment]

Now, a thin film transistor array panel according to an exemplary embodiment of the present invention will be described in more detail with reference to FIGS. 1 to 3.

FIG. 1 is a plan view layout of a thin film transistor array panel according to an exemplary embodiment of the present invention. FIGS. 2 and 3 are cross-sectional views of the thin film transistor array panel taken along lines II-II and III-III, respectively, of FIG. 1.

A plurality of gate lines 121 and a plurality of storage electrode lines 131 are formed on an insulating substrate 110 made of transparent glass or plastic.

The gate lines 121 transmit gate signals and extend mainly in a horizontal direction, as illustrated in FIG. 1. Each of the gate lines 121 includes a plurality of gate electrodes 124 protruding downward and a wide end portion 129 for connection with another layer or an external driving circuit (not shown). A gate driving circuit (not shown) which generates gate signals may be mounted on a flexible printed circuit film (not shown) attached to a top surface of the substrate 110. Otherwise, the gate driving circuit may be directly mounted on the substrate 110 or integrated onto the substrate 110. In the case where the gate driving circuit is directly integrated into the substrate 110, the gate lines 121 may extend so as to be directly connected to the gate driving circuit.

The storage electrode lines 131 are applied with a predetermined voltage, and include stem lines extending substantially parallel to the gate lines 121 and a plurality of pairs of storage electrodes 133a and 133b branched from the stem lines. Each storage electrode line 131 is positioned between two adjacent gate lines 121, and the stem line is located to be closer to one of the two adjacent gate lines 121. Each of the storage electrodes 133a and 133b has a fixed end connected to the stem line and a free end on the opposite side. The fixed end of one storage electrode 133a has a large area, and the free end thereof is bifurcated into two portions, that is, a linear branch and a curved branch. The shape and arrangement of the storage electrode lines 131 can be variously modified.

In exemplary embodiments, the gate lines 121 and storage electrode lines 131 may be made of an aluminum-containing metal such as aluminum (Al) or an aluminum alloy, a silver-containing metal such as silver (Ag) or a silver alloy, a copper-containing metal such as copper (Cu) or a copper alloy, a molybdenum-containing metal, such as molybdenum (Mo) or a molybdenum alloy, chromium (Cr), tantalum (Ta), titanium (Ti), or the like. However, the gate lines 121 may have a multilayer structure including two conductive layers (not shown) with physical properties which are different from each other. One of the conductive layers may be made of a metal with low resistivity in an effort to reduce signal delay or voltage drop, for example an aluminum-containing metal, a silver-containing metal, a copper containing-metal, or the like. Different from the one conductive layer, the other conductive layer may be made of another material with excellent physical, chemical and electrical contact characteristics with indium tin oxide ("ITO") and indium zinc oxide ("IZO"), for example a molybdenum-containing metal, chromium, tantalum, titanium, or the like. Ideal examples of such combination may be a structure consisting of a chromium lower layer and an aluminum (alloy) upper layer, or a structure consisting of an aluminum (alloy) lower layer and a molybdenum (alloy) upper layer. However, the gate lines 121 and the storage electrode lines 131 can be made of various metals or conductors other than the above-described materials.

The side surfaces of the gate lines 121 and storage electrode lines 131 are inclined relative to the surface of the substrate 110. Desirably, the surfaces are inclined at an angle in the range of about 30 degrees to about 80 degrees.

A gate insulating layer 140 which is desirably made of silicon nitride ("SiNx") or silicon oxide ("SiOx") is formed on the gate lines 121 and the storage electrode lines 131.

A plurality of semiconductor stripes 151 made of polycrystalline silicon are formed on the gate insulating layer 140. The semiconductor stripes 151 extend mainly in a vertical direction, as illustrated in FIG. 1, and include a plurality of projections 154 protruding toward the gate electrode 124.

A plurality of ohmic contact stripes and islands 161 and 165, respectively, are formed on the semiconductor stripes 151. The ohmic contact stripes and islands 161 and 165 may be made of materials such as n+ hydrogenated amorphous silicon which is highly doped with an n-type impurity such as phosphorus (P). The ohmic contact stripe 161 has a plurality of projections 163, and the projection 163 and the ohmic contact island 165 form a pair so as to be disposed on the projection 154 of the semiconductor stripe 151.

The side surface of the semiconductor stripe 151 and the ohmic contacts 161 and 165 is inclined relative to the surface of the substrate 110, and the side surface is inclined by an angle in the range of about 30 degrees to about 80 degrees.

A plurality of data lines 171 and a plurality of drain electrodes 175 are formed on the ohmic contacts 161 and 165 and the gate insulating layer 140.

The data lines 171 transmit data signals, and extend mainly in the vertical direction so as to cross the gate lines 121, as illustrated in FIG. 1. Each data line 171 also crosses the storage electrode line 131, and extends between adjacent storage electrodes 133a and 133b, which form a set. Each data line 171 includes a plurality of source electrodes 173 extending toward the gate electrode 124, and a wide end portion 179 which is provided for connection with another layer or an external driving circuit (not shown). A data driving circuit (not shown) that generates data signals may be mounted on a flexible printed circuit film (not shown) which is attached to the top surface of the substrate 110. Otherwise, the data driving circuit may be directly mounted on the substrate 110, or integrated onto the substrate 110. In the case where the data driving circuit is integrated into the substrate 110, the data lines 171 extend so as to be directly connected to the data driving circuit.

The drain electrodes 175 are separated from the data lines 171, and are located to face the source electrodes 173 on the projection 154 of the semiconductor stripe 151.

As described above, as the ohmic contacts 161 and 165 are made of n+hydrogenated amorphous silicon polysilicon on the semiconductor stripe 151 made of polysilicon, an ohmic contact can be formed between the polycrystalline semiconductor stripe 151 and the source electrode 173 and drain electrode 175 without separate ion doping.

One gate electrode 124, one source electrode 173 and one drain electrode 175 form a thin film transistor ("TFT") together with the projection 154 of the semiconductor stripe 151, and a channel of a TFT is formed in the projection 154 between the source electrode 173 and drain electrode 175.

It is desirable that the data lines 171 and the drain electrodes 175 are made of refractory metals, such as molybdenum, chromium, tantalum, or titanium or alloys comprising at least one of the foregoing metals. The data lines 171 and drain electrodes 175 may have a multilayer structure including a refectory metal film (not shown) and a conductive layer (not shown) of low resistance. Exemplary embodiments of the multilayer structure may include a double-layer structure consisting of a chromium or molybdenum (alloy) lower layer and an aluminum (alloy) upper layer, and a triple-layer structure consisting of a molybdenum (alloy) lower layer, an aluminum (alloy) intermediate layer, and a molybdenum (alloy) upper layer. However, the data lines 171 and the drain electrodes 175 may be made of various metals or conductors, in addition to the above-described exemplary embodiments.

It is desirable that the side surfaces of the data lines 171 and drain electrodes 175 are inclined by an angle in the range of about 30 degrees to about 80 degrees with respect to the surface of the substrate 110.

A passivation layer 180 is formed on the data lines 171, the drain electrodes 175 and the exposed portions of projection 154 of the semiconductor stripes 151. The passivation layers 180 may be made of an inorganic insulating material or an organic insulating material, and the surface thereof may be flat. Examples of the inorganic insulating material may include silicon nitride ("SiNx") and silicon oxide ("SiOx"). The organic insulating material may be photosensitive, and its dielectric constant is preferably 4.0 or less. However, the passivation layer 180 may have a double-layer structure consisting of a lower inorganic layer and an upper inorganic layer to prevent damage to the exposed portion of the projection 154, while preserving excellent insulating characteristics of an organic film.

A plurality of contact holes 182 and 185 for exposing the end portions 179 of the data lines 171 and the drain electrodes 175, respectively, are formed in the passivation layer 180. Further, a plurality of contact holes 181 exposing the end portion 129 of the gate lines 121, a plurality of contact holes 183a exposing a portion of the storage electrode line 131 in the vicinity of the fixed end of the first storage electrode 133a, and a plurality of contact holes 183b exposing the projection of the free end of the first storage electrode 133a are formed in the passivation layer 180 and the gate insulating layer 140.

A plurality of pixel electrodes 191, a plurality of overpasses 83, and a plurality of contact assistants 81 and 82 are formed on the passivation layer 180. These may be made of a transparent conductive material such as ITO or IZO, or a reflective metal such as aluminum, silver, chromium, or an alloy thereof.

Figure 2:
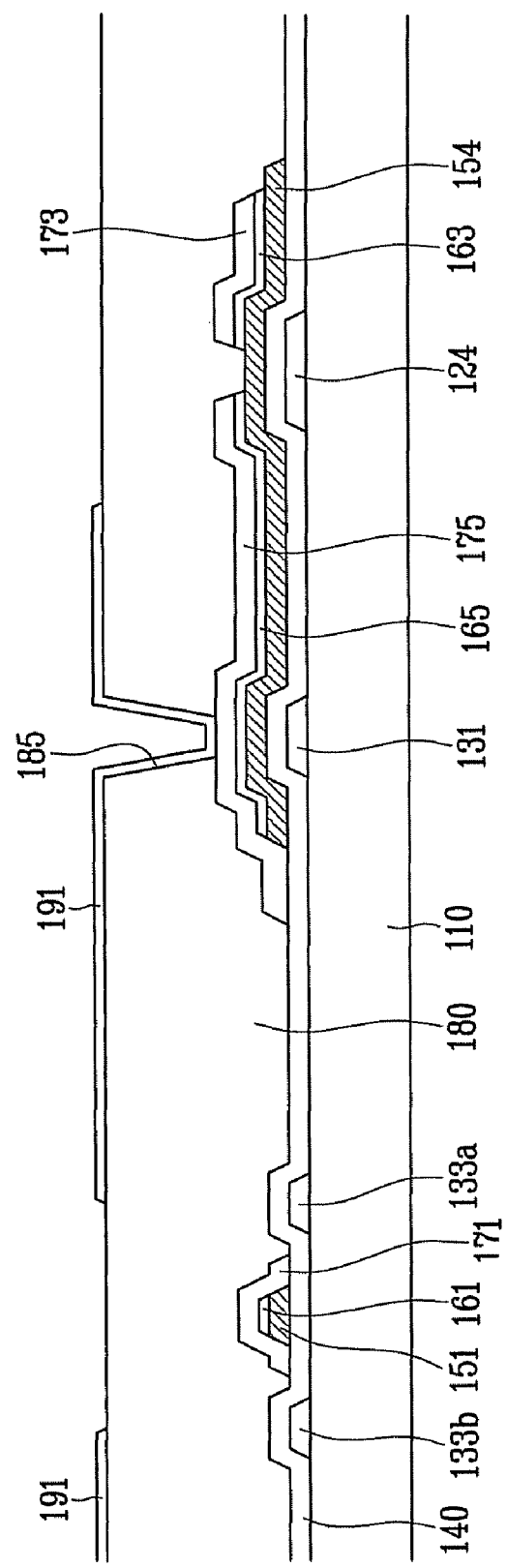
FIGS. 2 and 3 are cross-sectional views of the thin film transistor array panel taken along lines II-II and III-III, respectively, of FIG. 1, FIGS. 4, 9, 12, and 15 are plan view layouts sequentially showing a method of manufacturing a thin film transistor array panel according to an exemplary embodiment of the present invention.

The pixel electrode 191 is physically and electrically connected to the drain electrode 175 through the contact hole 185, as best seen with reference to FIG. 2, and applied with a data voltage through the drain electrode 175. The pixel electrode 191 applied with a data voltage generates an electric field together with a common electrode (not shown) of another display panel (not shown) which is applied with a common voltage. Thus, the alignment direction of liquid crystal molecules of a liquid crystal layer between the two electrodes is determined. Polarization of light passing through the liquid crystal layer changes in accordance with the determined alignment direction of the liquid crystal molecules. The pixel electrode 191 and the common electrode (not shown) form a capacitor (hereinafter, referred to as "liquid crystal capacitor") so as to sustain the applied voltage even after the TFT is turned off.

The pixel electrode 191 overlaps the storage electrode line 131, as well as overlapping the storage electrodes 133a and 133b, and a capacitor formed by overlapping the pixel electrode 191 and the drain electrode 175 electrically connected to the pixel electrode 191 with respect to the storage electrode line 131 is called a storage capacitor. The storage capacitor improves the voltage storage ability of the liquid crystal capacitor.

The contact assistants 81 and 82 are respectively connected to the end portions 129 of the gate lines 121 and the end portions 179 of the data lines 171 through the contact holes 181 and 182. The contact assistants 81 and 82 assist connection between the end portions 129 of the gate lines 121 and the end portions 179 of the data lines 171, and an external device (not shown), and protect these portions.

The overpasses 83 are located to cross the gate lines 121, and are connected to an exposed portion of the storage electrode line 131 and an exposed end of the free end of the storage electrode 133b through the contact holes 183a and 183b located on the opposite side with respect to the gate line 121. The storage electrode lines 131 as well as the storage electrodes 133a and 133b can be used in repairing defects of the gate lines 121 or data lines 171 or the TFT together with the overpasses 83.

Next, a method of manufacturing a thin film transistor array panel shown in FIGS. 1 to 3 will be described in more detail with reference to FIGS. 4 to 17.

Figure 7:
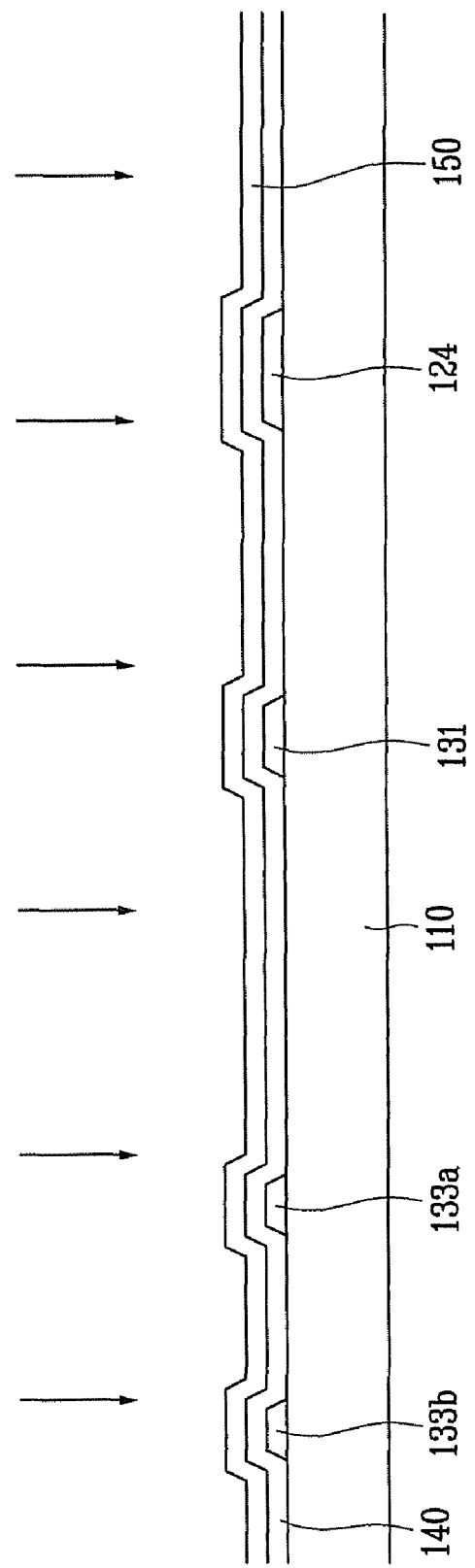
Figure 8:
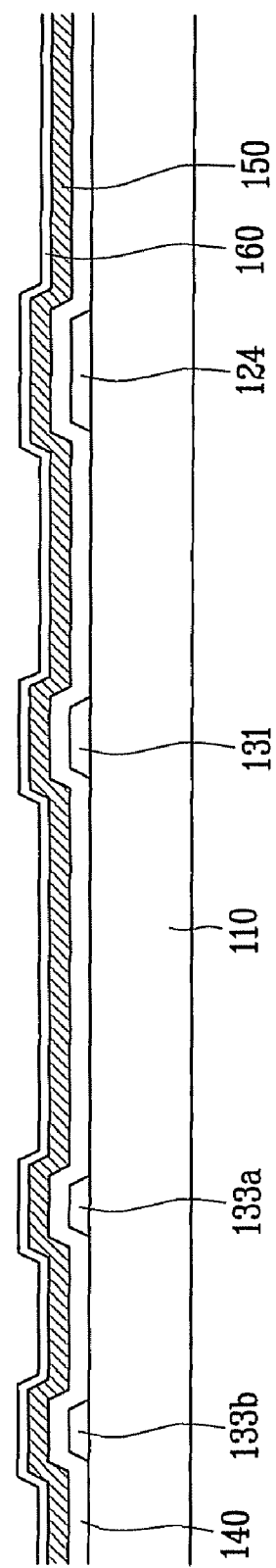

FIGS. 4, 9, 12, and 15 are plan view layouts sequentially showing processes of a method of manufacturing the thin film transistor array panel according to an exemplary embodiment of the present invention. FIGS. 5 and 6 are cross-sectional views of the thin film transistor array panel taken along lines V-V and VI-VI of FIG. 4, respectively. FIGS. 7 and 8 are cross-sectional views showing the processes subsequent to processes of FIGS. 4 to 6. FIGS. 10 and 11 are cross-sectional views of the thin film transistor array panel taken along lines X-X and XI-XI, respectively, of FIG. 9. FIGS. 13 and 14 are cross-sectional views of the thin film transistor array panel taken along lines XIII-XIII and XIV-XIV, respectively, of FIG. 12. FIGS. 16 and 17 are cross-sectional views of the thin film transistor array panel taken along lines XVI-XVI and XVII-XVII, respectively, of FIG. 15.

Figure 4:
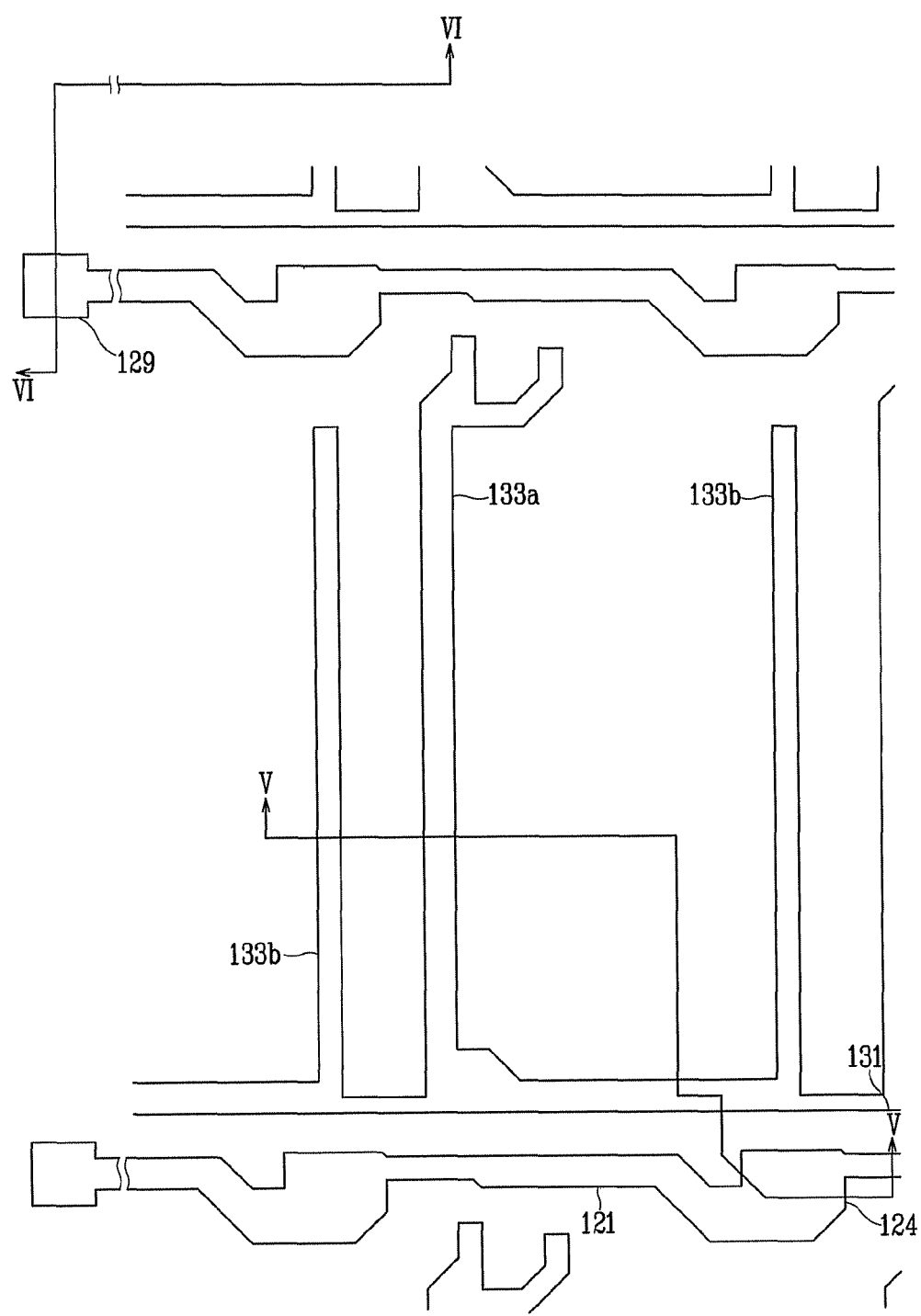
Figure 5:
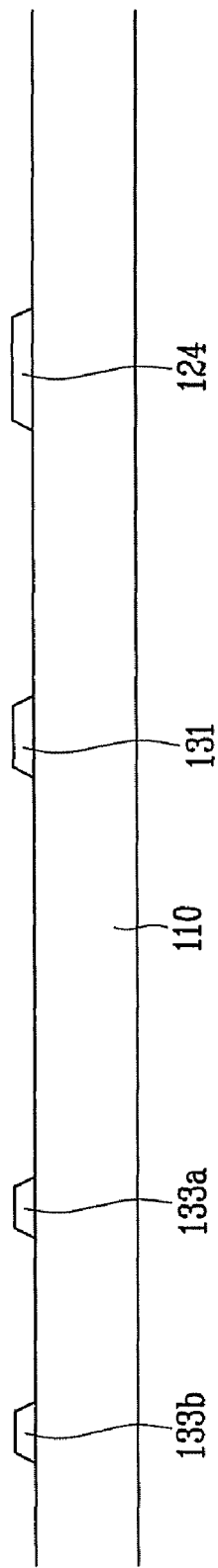
FIGS. 5 and 6 are cross-sectional views of the thin film transistor array panel taken along lines V-V and VI-VI, respectively, of FIG. 4, FIGS. 7 and 8 are cross-sectional views showing processes subsequent to processes of FIGS. 4 to 6, FIGS. 10 and 11 are cross-sectional views of the thin film transistor array panel taken along lines X-X and XI-XI, respectively, of FIG. 9, FIGS. 13 and 14 are cross-sectional views of the thin film transistor array panel taken along lines XIII-XIII and XIV-XIV, respectively, of FIG. 12, FIGS. 16 and 17 are cross-sectional views of the thin film transistor array panel taken along lines XVI-XVI and XVII-XVII, respectively, of FIG. 15.
Figure 6:
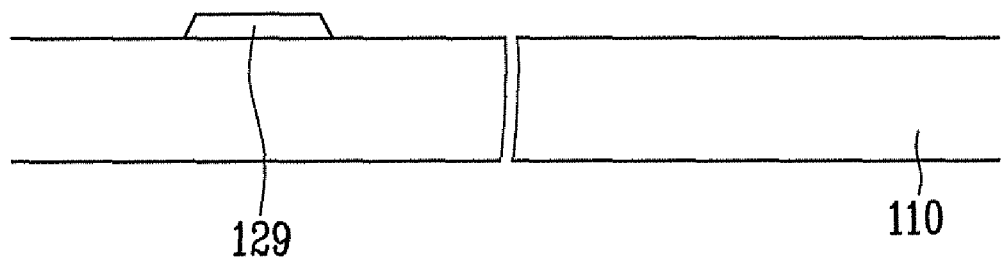

First, as shown in FIGS. 4 to 6, a conductive layer is formed on the insulating substrate 110 by sputtering and then etched through photolithography. As a result thereof, the plurality of gate lines 121 including the gate electrodes 124 and the end portions 129 and the plurality of storage electrode lines 131 including the storage electrodes 133a and 133b are formed.

Next, as shown in FIG. 7, the gate insulating layer 140 made of silicon nitride and a semiconductor layer 150 made of amorphous silicon are consecutively formed on the gate lines 121 and the storage electrode lines 131 through plasma enhanced chemical vapor deposition ("PECVD").

Next, the amorphous semiconductor layer 150 is crystallized by solid phase crystallization ("SPC") method. The crystallized portion of the semiconductor layer 150 is indicated by oblique lines in FIG. 7.

Next, as shown in FIG. 8, an impurity semiconductor (n+ a-Si) layer 160 which is highly doped with an impurity is formed on the crystallized semiconductor layer 150.

Figure 9:
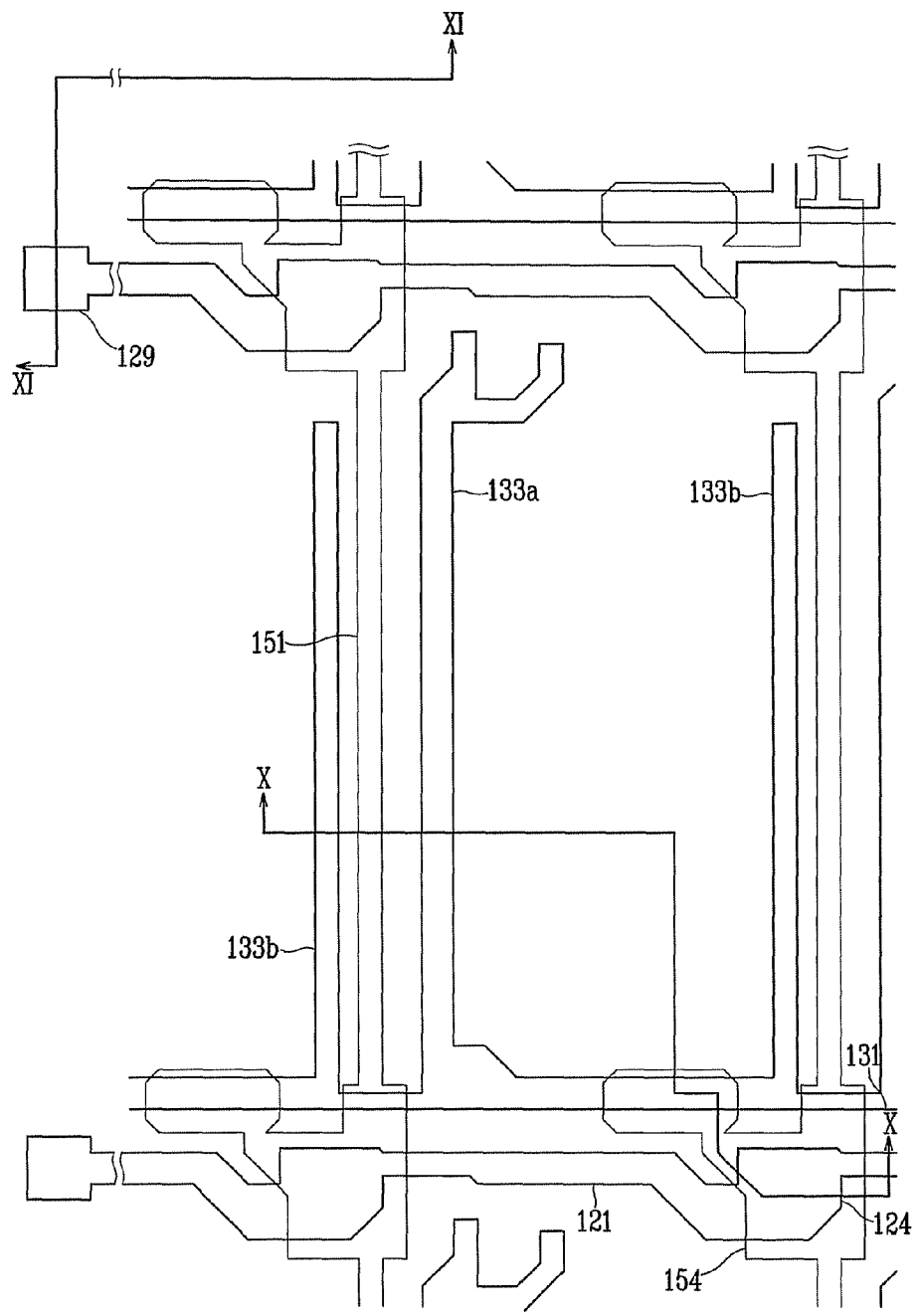
Figure 10:
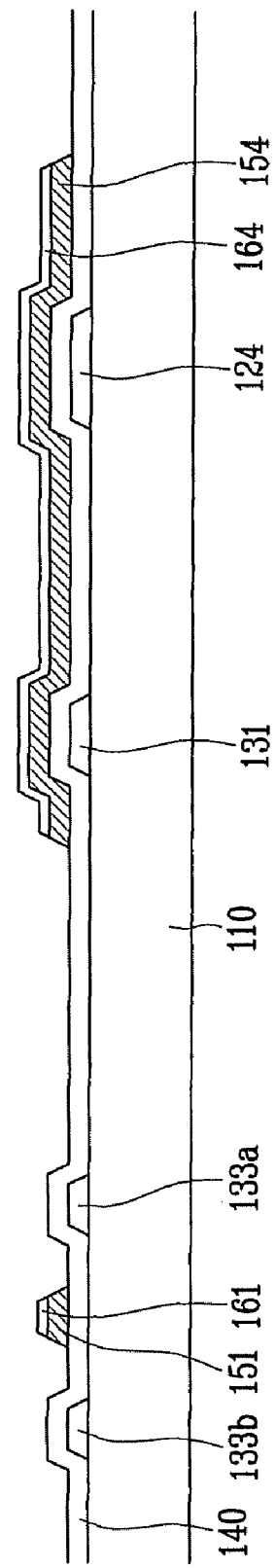
Figure 11:
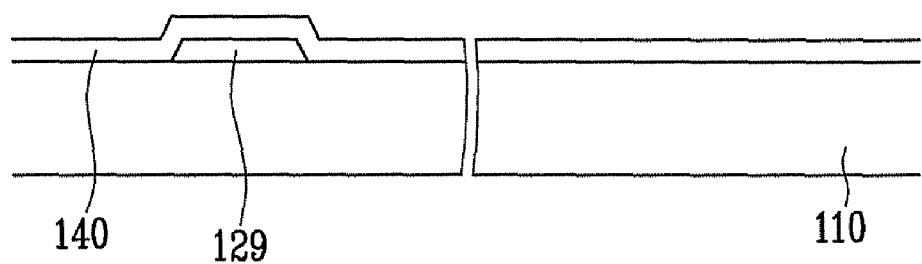

Next, as shown in FIGS. 9 to 11, the crystallized semiconductor layer 150 and the impurity semiconductor layer 160 are etched through photolithography, thereby forming the polycrystalline semiconductor stripe 151 including the projection 154 and the ohmic contacts 161 and 164.

Figure 12:
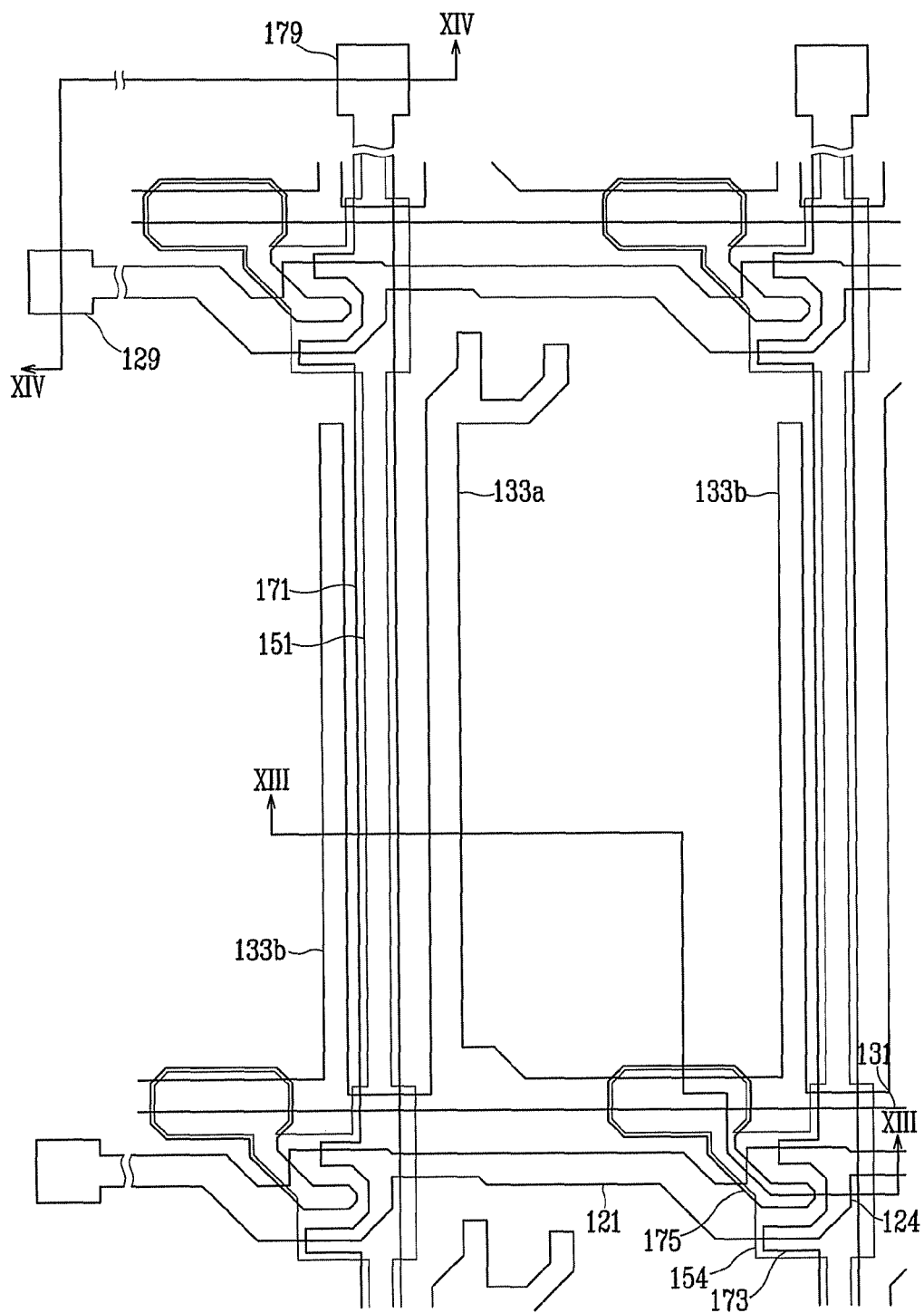
Figure 13:
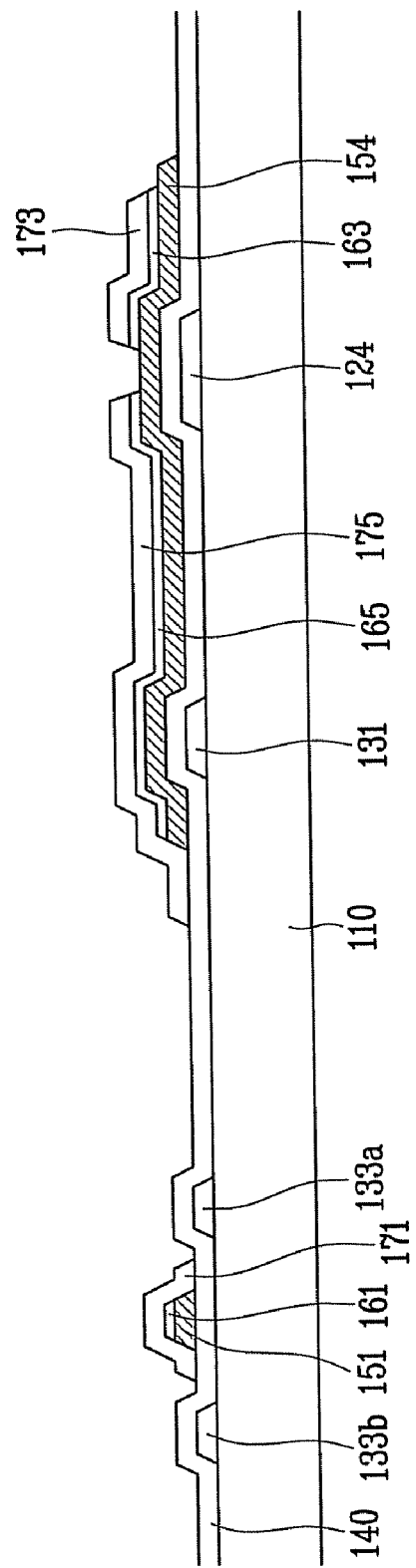
Figure 14:
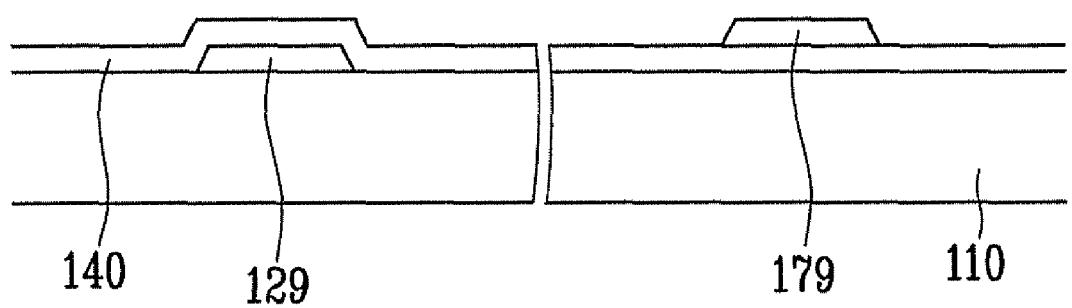

Next, as shown in FIGS. 12 to 14, a conductive layer is formed on the gate insulating layer 140 and the ohmic contacts 161 and 164 by sputtering and etched through photolithography, thereby forming the data lines 171 including the source electrodes 173, end portions 179 and the drain electrodes 175.

Then, the ohmic contact 164 exposed between the data lines 171 and the drain electrodes 175 is dry etched so as to expose the projection 154 of the polycrystalline semiconductor stripe 151.

Figure 15:
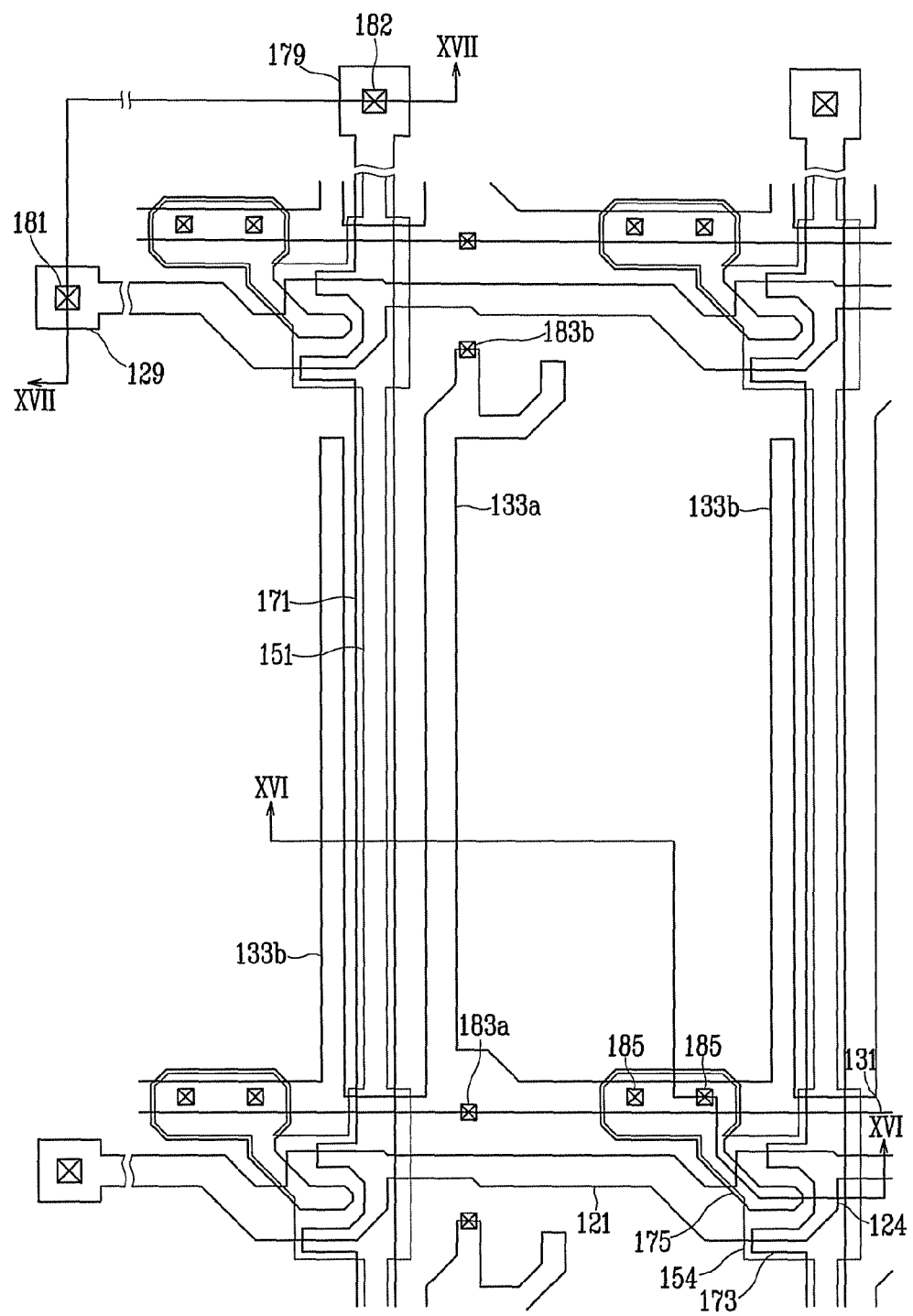
Figure 16:
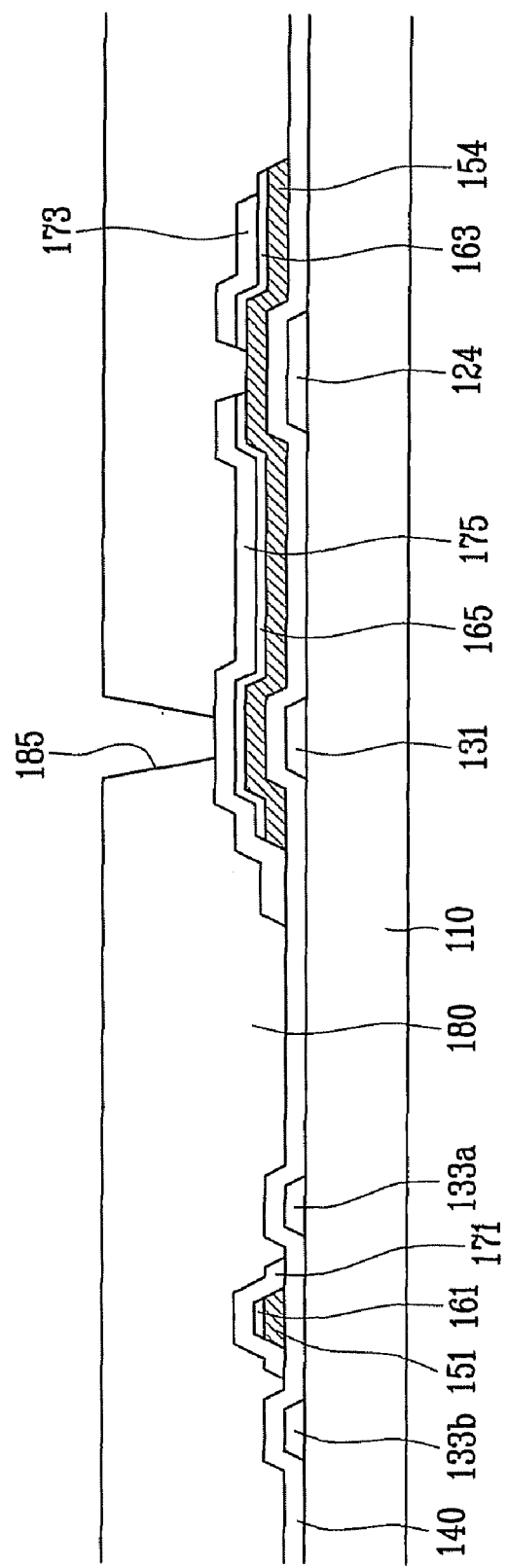
Figure 17:
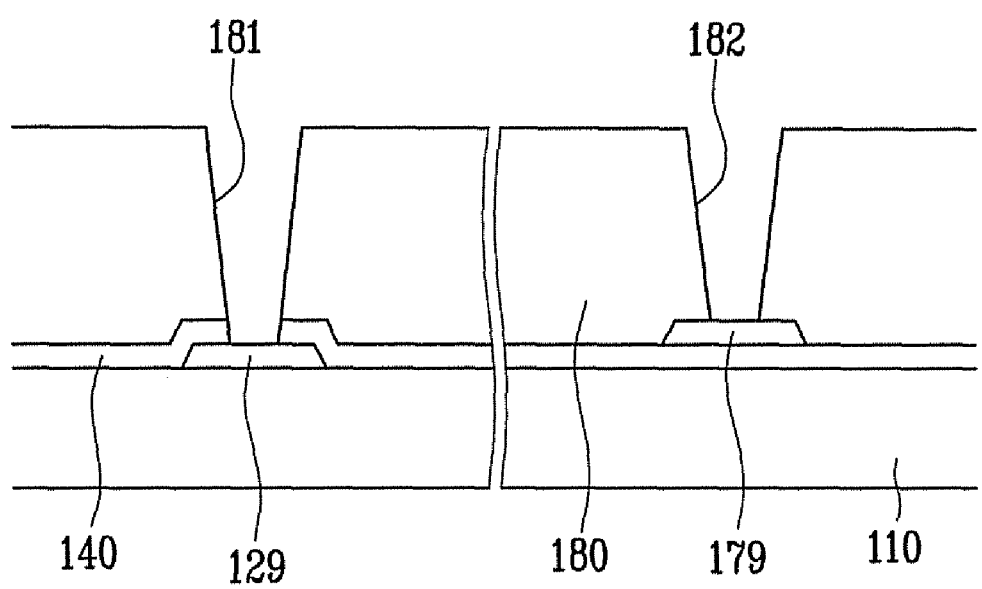

Next, as shown in FIGS. 15 to 17, the passivation layer 180 is formed on the data lines 171 and drain electrodes 175 and then etched through photolithography, thereby forming a plurality of contact holes 181, 182, 183a, 183b and 185.

Figure 3:
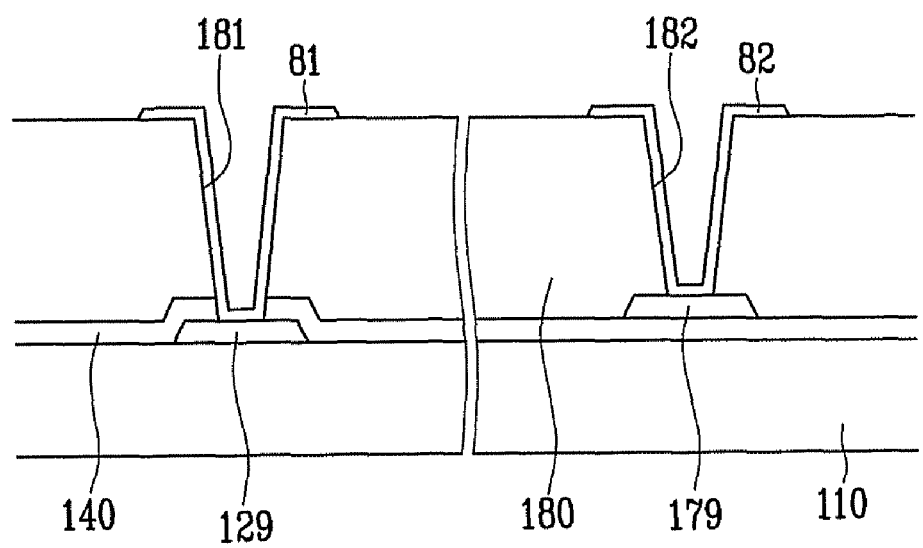

Finally, as shown in FIGS. 1 to 3, a transparent conductive material, such as ITO or IZO, is formed on the passivation layer 180 by sputtering and then etched through photolithography, thereby forming the pixel electrodes 191, the contact assistants 81 and 82, and the overpasses 83.

As described above, as the thin film transistor array panel according to the present exemplary embodiment includes the polycrystalline semiconductor, high field effect mobility is ensured. Further, since the thin film transistor can be formed without an additional mask or an ion doping process by using a bottom gate structure, the number of processes and cost of manufacturing can be significantly decreased.

[Second Embodiment]

Hereinafter, a thin film transistor array panel according to another exemplary embodiment will be described with reference to FIG. 18. Repeated drawings and description as compared with those of the first exemplary embodiment will be omitted.

Figure 18:
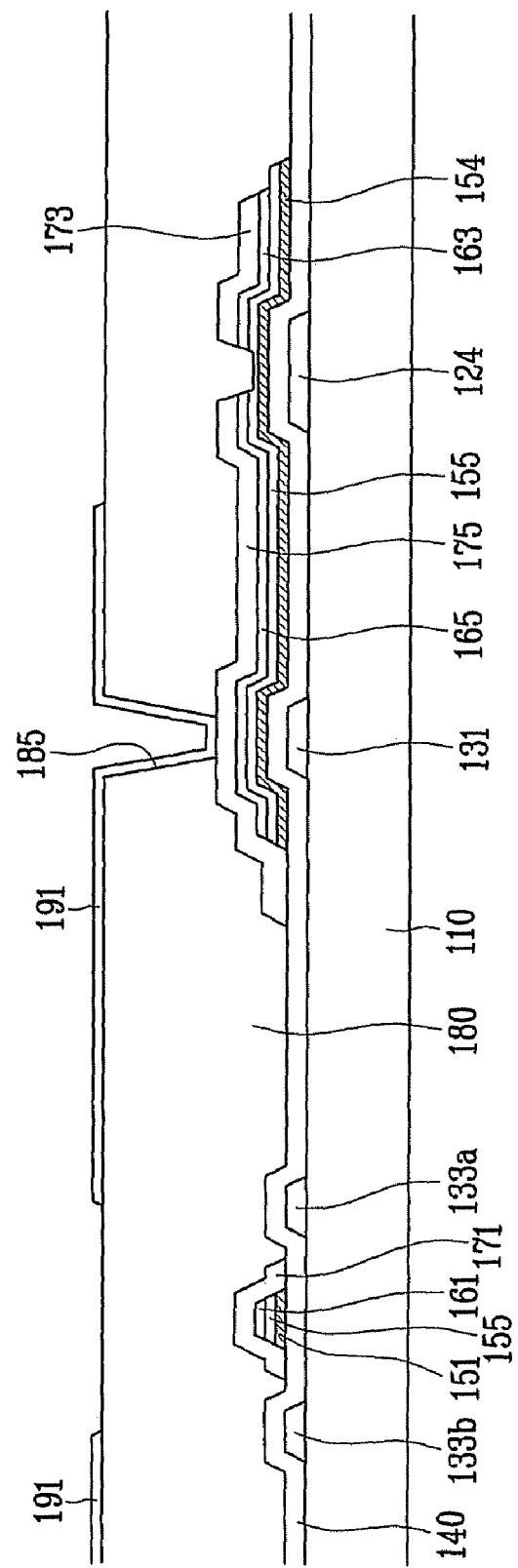
FIG. 18 is a cross-sectional view of a thin film transistor array panel according to another exemplary embodiment of the present invention.

FIG. 18 is a cross-sectional view of a thin film transistor array panel according to the present exemplary embodiment of the present invention.

Gate lines 121 including gate electrodes 124, end portions 129 and storage electrode lines 131 including storage electrodes 133a and 133b are formed on an insulating substrate 110.

A gate insulating layer 140 is formed on the gate lines 121 and the storage electrode lines 131.

A semiconductor stripe 151 formed of polysilicon ("poly-Si"), an assistant layer 155 made of amorphous silicon ("a-Si"), and ohmic contact stripes and islands 161 and 165, respectively, formed of amorphous silicon highly doped with an impurity such as phosphorus (P) are sequentially deposited on the gate insulating layer 140.

The semiconductor stripe 151 includes a plurality of projections 154.

The ohmic contact stripe 161 includes a plurality of projections 163, and the projection 163 and the ohmic contact island 165 form a pair so as to be disposed on the projection 154 of the semiconductor stripe 151.

The assistant layer 155 is a buffer layer serving as a lightly doped drain ("LDD"), and prevents an increase of a leakage current in the semiconductor stripes 151. Further, the assistant layer 155 is a protective layer for preventing the polycrystalline semiconductor stripes 151 from being etched, and prevents damage to a back channel of the TFT.

The drain electrodes 175 and the data lines 171 including source electrodes 173 are formed on the ohmic contacts 161 and 165 and the gate insulating layer 140.

The assistant layer 155 is exposed between the source electrode 173 and the drain electrode 175, and the exposed portion of the assistant layer 155 has a smaller thickness than the other portions.

A passivation layer 180 having a plurality of contact holes 181, 182, 183a, 183b and 185 is formed on the data lines 171 and the drain electrodes 175. Pixel electrodes 191 and the overpass 83 and the contact assistants 81 and 82 are formed on the passivation layer 180.

Next, a method of manufacturing a thin film transistor array panel shown in FIG. 18 will be described in more detail with reference to FIGS. 19 to 22.

FIGS. 19 to 22 are cross-sectional views sequentially showing the processes of manufacturing the thin film transistor array panel of FIG. 18.

Figure 19:
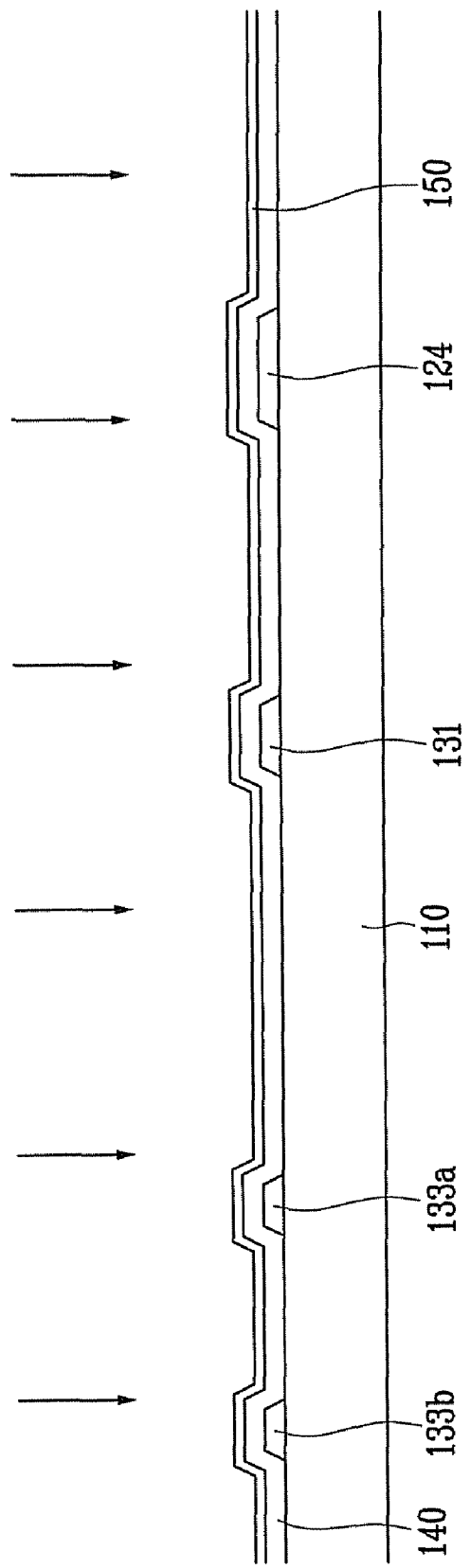
FIGS. 19 to 22 are cross-sectional views sequentially showing processes of manufacturing the thin film transistor array panel of FIG. 18.

As shown in FIG. 19, the plurality of gate lines 121 including the gate electrodes 124 and the end portions 129 and the plurality of storage electrode lines 131 including the storage electrodes 133a and 133b are formed on the insulating substrate 110. The gate insulating layer 140 made of silicon nitride and the lower semiconductor layer 150 made of amorphous silicon are then formed thereon.

Next, the lower semiconductor layer 150 is crystallized by the solid phase crystallization ("SPC") method.

Figure 20:
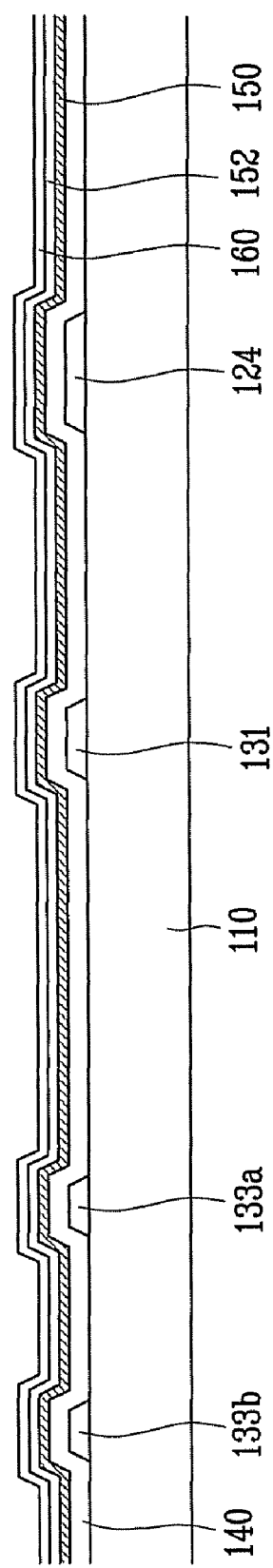

Next, as shown in FIG. 20, an upper semiconductor layer 152 made of amorphous silicon and the impurity semiconductor layer 160 are formed on the crystallized lower semiconductor layer 150.

Figure 21:
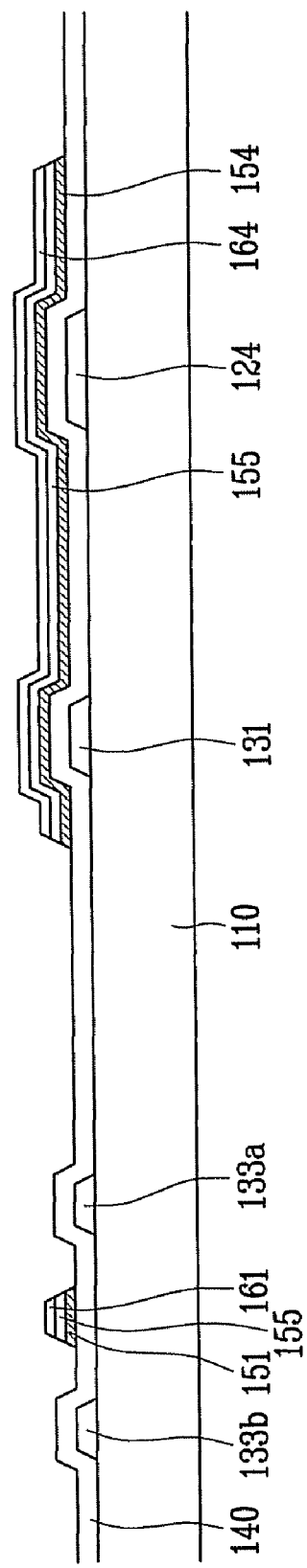

Next, as shown in FIG. 21, the lower semiconductor layer 150, the upper semiconductor layer 152, and the impurity semiconductor layer 160 are etched at one time so as to form the polycrystalline semiconductor stripes 151 including a projection 154, the assistant layer 155 made of amorphous silicon, and the ohmic contacts 161 and 164.

Figure 22:
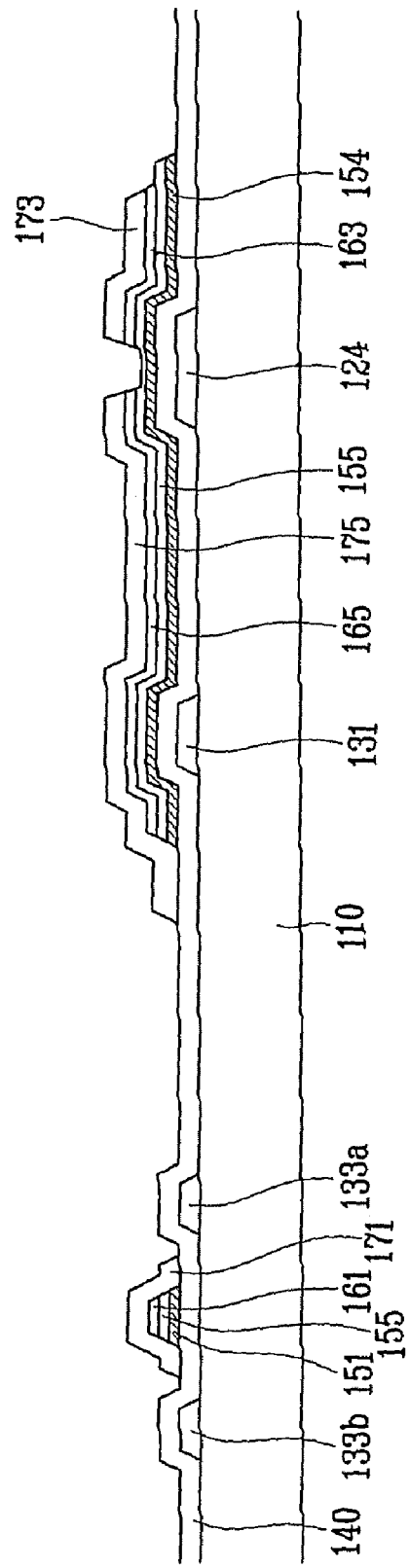

Next, as shown in FIG. 22, the data lines 171 including the source electrodes 173 and the drain electrodes 175 are formed on the gate insulating layer 140 and the ohmic contacts 161 and 164 (shown as 163 and 165).

Sequentially, the ohmic contact 164 exposed between the data line 171 and drain electrode 175 is dry etched so as to expose the assistant layer 155. In this case, the assistant layer 155 between the data line 171 and the drain electrode 175 is also partially etched, and thus the etched portion of the assistant layer 155 is made to be thinner.

The assistant layer 155 prevents the polycrystalline semiconductor stripes 151 from being etched when the ohmic contacts 161 and 164 are etched in the bottom gate structure including the ohmic contacts 161 and 164 for ohmic contact on the polycrystalline semiconductor stripes 151. Therefore, the back channel of the polycrystalline semiconductor stripes 151 is kept from being damaged. Further, considering that the semiconductor is partially etched in a step of etching the ohmic contacts 161 and 164, it is unnecessary to form the ohmic contacts excessively thick, which makes it easy to perform crystallization.

Next, as shown in FIG. 18, the passivation layer 180 having the plurality of contact holes 181, 182, and 185 is formed on the data lines 171 and the drain electrodes 175, and then the pixel electrodes 191, the contact assistants 81 and 82, and the overpasses 83 are formed thereon.

[Third Embodiment]

Hereinafter, a thin film transistor array panel according to yet another exemplary embodiment will be described in more detail with reference to FIG. 23. Repeated drawings and description as compared with those of the above-described first and second exemplary embodiments will be omitted.

Figure 23:
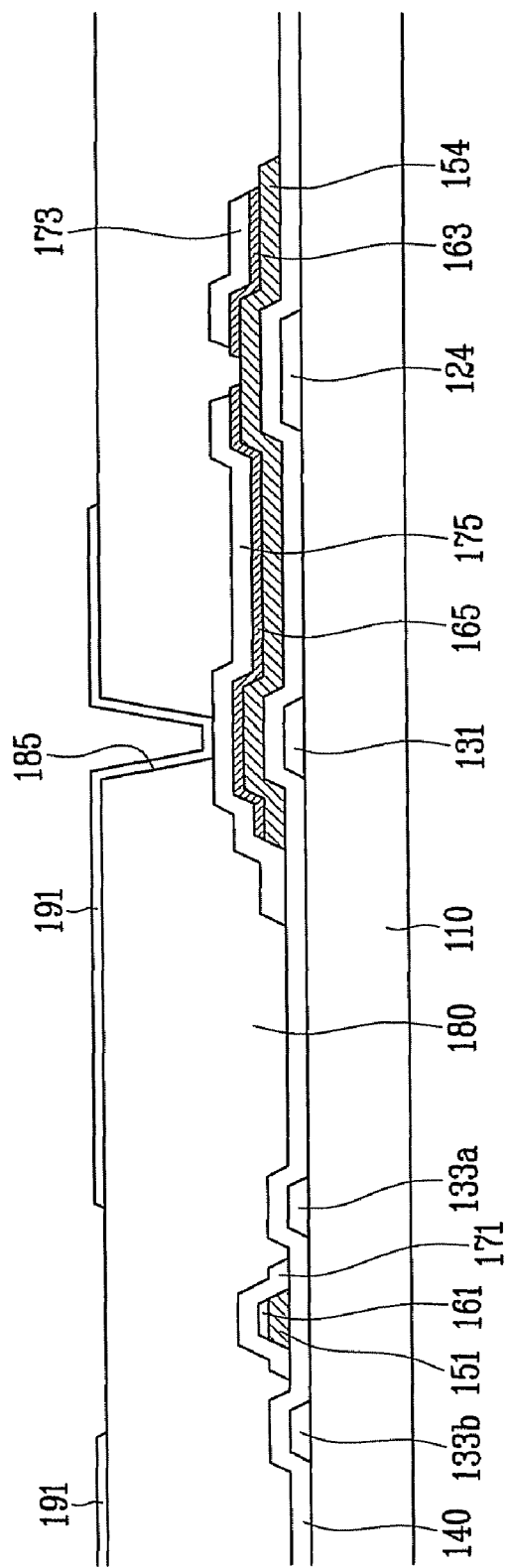
FIG. 23 is a cross-sectional view of the thin film transistor array panel according to another exemplary embodiment of the present invention.

FIG. 23 is a cross-sectional view of the thin film transistor array panel according to the present exemplary embodiment of the present invention.

Gate lines 121 including gate electrodes 124, end portions 129 and storage electrode lines 131 including storage electrodes 133a and 133b are formed on an insulating substrate 110.

A gate insulating layer 140 is formed on the gate lines 121 and the storage electrode lines 131.

Semiconductor stripes 151 including a projection 154 made of polysilicon ("poly-Si") and ohmic contacts 163 and 165 made of polysilicon ("poly-Si") highly doped with an impurity such as phosphorus are sequentially deposited on the gate insulating layer 140.

A passivation layer 180 having a plurality of contact holes 181, 182, 183a, 183b and 185 is formed on the data lines 171 and the drain electrodes 175. Pixel electrodes 191, overpasses 83, and contact assistants 81 and 82 are formed on the passivation layer 180.

Next, a method of manufacturing the thin film transistor array panel shown in FIG. 23 will be described in more detail with reference to FIGS. 24 to 26.

Figure 24:
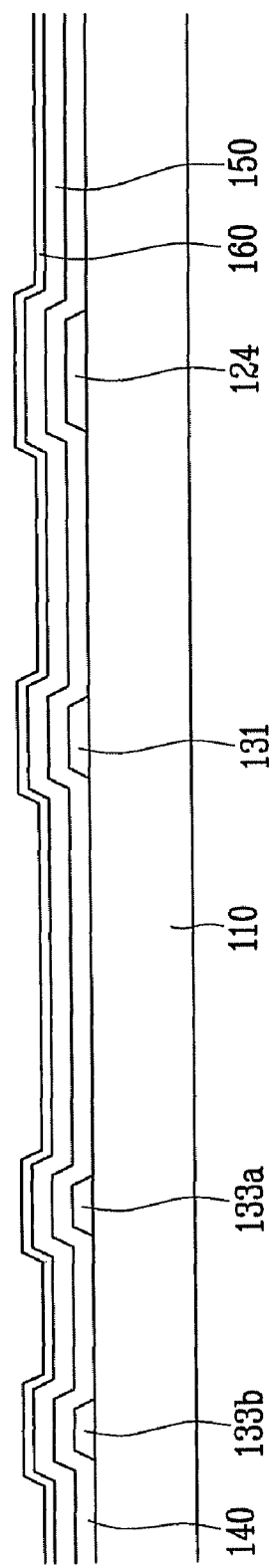
FIGS. 24 to 26 are cross-sectional views sequentially showing the processes of manufacturing the thin film transistor array panel of FIG. 23.
Figure 25:
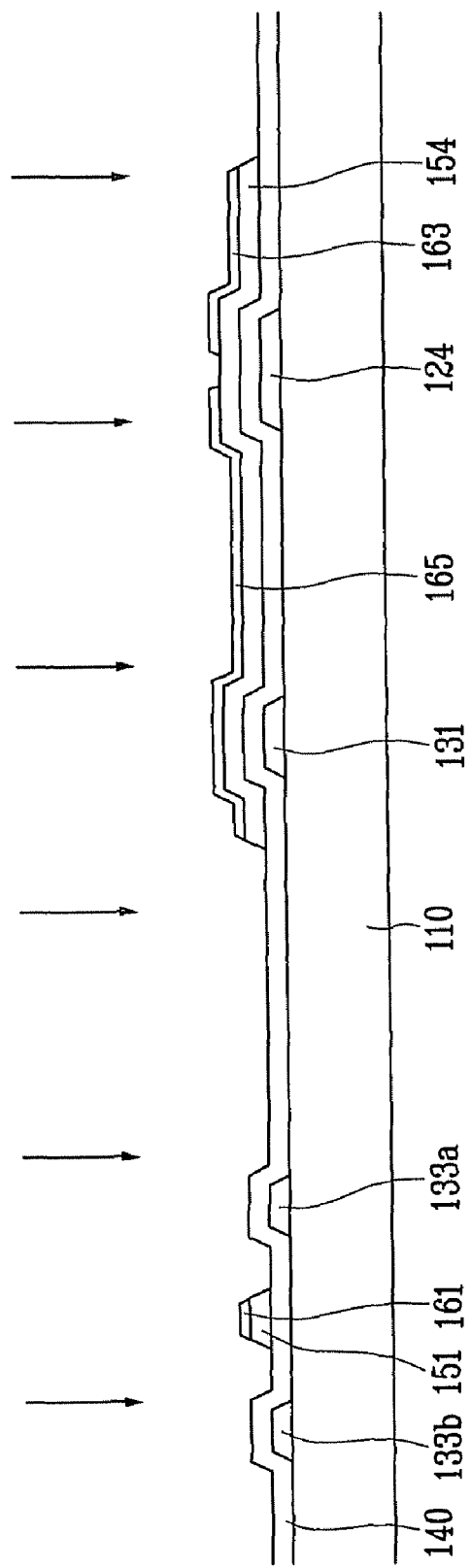
Figure 26:
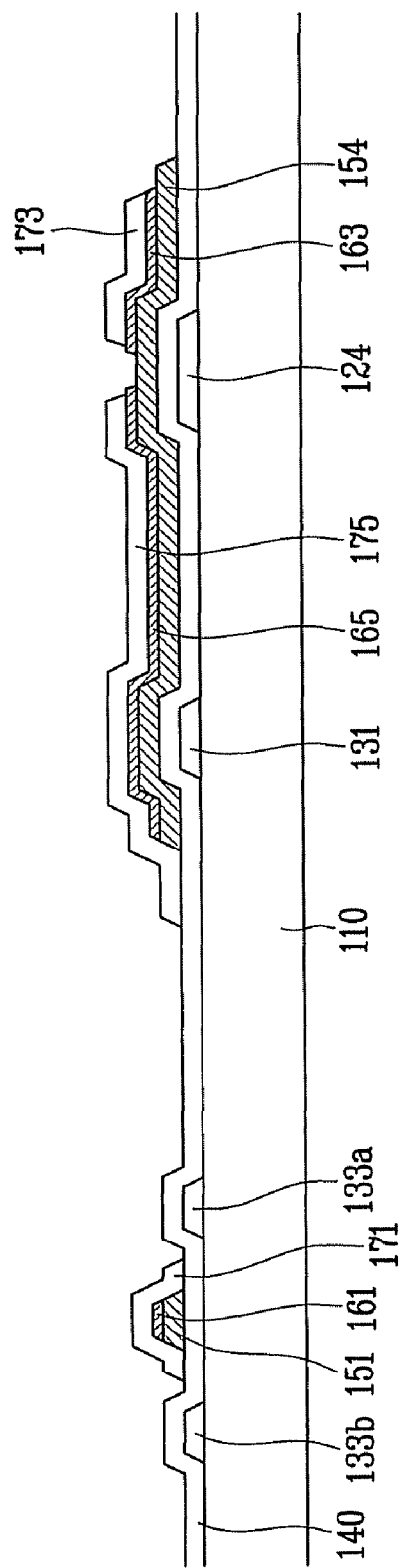

FIGS. 24 to 26 are cross-sectional views sequentially showing processes of manufacturing the thin film transistor array panel of FIG. 23.

As shown in FIG. 24, the plurality of gate lines 121 including the gate electrodes 124, the end portions 129 and the plurality of storage electrode lines 131 including the storage electrodes 133a and 133b are formed on the insulating substrate 110, and then the gate insulating layer 140, the intrinsic amorphous silicon layer 150, and the impurity amorphous silicon layer 160 are sequentially formed thereon.

Next, a photosensitive pattern (not shown) having an uneven thickness is formed on the impurity amorphous silicon layer 160. The photosensitive pattern is formed thinner in a region where a channel is formed on the gate electrode 124 than in other regions.

Various methods may exist for forming a photosensitive pattern having a different thickness. For example, an exposure mask includes not only a transparent region and a light blocking region, but also a semi-transparent region. The semi-transparent region has a slit pattern, a lattice pattern, or a thin film having medium transmittance and a medium thickness. When using the slit pattern, it is preferable that a slit width or an interval between slits is smaller than the resolution of a light exposer used in a photolithography process. Using a photosensitive film which is capable of reflowing can be taken as another example. In other words, the photosensitive pattern which is capable of reflowing is formed of a general mask including only transparent and light blocking regions, and is then allowed to reflow so as to flow into a region where the photosensitive film does not remain, thereby forming a thin portion.

Next, as shown in FIG. 25, the intrinsic amorphous silicon layer 150 and the impurity amorphous silicon layer 160 are etched by using the above-described photosensitive pattern (not shown), thereby forming the ohmic contacts 163 and 165 that are partially removed at the semiconductor stripes 151 including the projections 154 and the channel portions.

Next, the semiconductor stripes 151 and the ohmic contacts 163 and 165 are crystallized by the SPC method, thereby forming the polycrystalline semiconductor stripes 151 including the projections 154 and the polycrystalline ohmic contacts 163 and 165. In this case, the polycrystalline semiconductor stripes 151, from which the ohmic contacts 163 and 165 are partially removed, can be formed in the channel.

Next, as shown in FIG. 26, the data lines 171 including the source electrodes 173 and the drain electrodes 175 are formed on the gate insulating layer 140, the crystallized semiconductor stripes 151, and the crystallized ohmic contacts 163 and 165.

Next, as shown in FIG. 23, the passivation layer 180 having the plurality of contact holes 181, 182, 183a, 183b and 185 (only 185 shown in FIG. 23) is formed on the data lines 171 and the drain electrodes 175, and then the pixel electrodes 191, the contact assistants 81 and 82, and the overpasses 83 are formed thereon.

Unlike the above-described first and second exemplary embodiments, the ohmic contacts 163 and 165 also have a polycrystalline structure in the present exemplary embodiment. As described above, the ohmic contacts 163 and 165 formed between the polycrystalline semiconductor stripes 151 and the source electrodes 173 and the drain electrodes 175 also have the polycrystalline structure, which optimizes the benefits of the polycrystalline semiconductor, thereby improving field effect mobility.

Further, the impurity semiconductor layers are consecutively formed on the amorphous semiconductor layer and then crystallized at one time, thereby simplifying the process for manufacturing the thin film transistor array panel.

Furthermore, the amorphous semiconductor layer and the impurity semiconductor layer are etched by using a photosensitive pattern having a different thickness. As a result, the amorphous semiconductor layer can be crystallized in an exposed state in a channel, and a separate etching process for removing the ohmic contact in the channel after forming the data lines can be omitted.

[Fourth Embodiment]

Hereinafter, a thin film transistor array panel according to still another exemplary embodiment will be described in more detail with reference to FIG. 27. Repeated drawings and description as compared with the above-described exemplary embodiments will be omitted.

Figure 27:
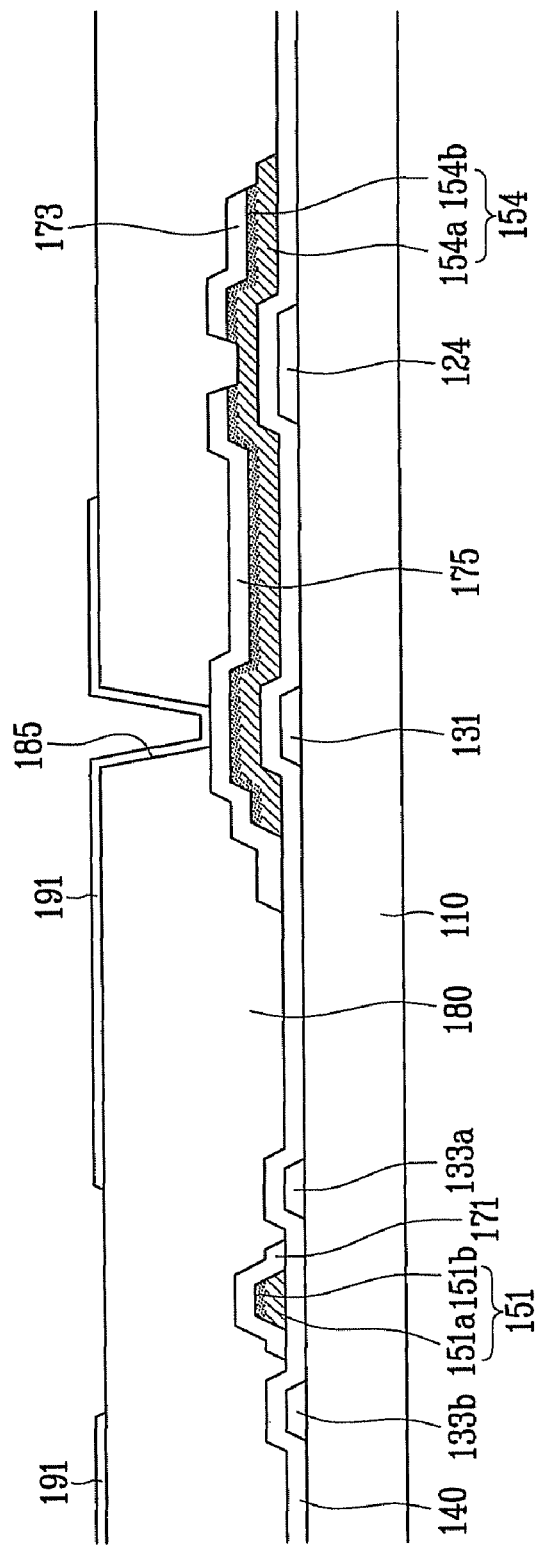
FIG. 27 is a cross-sectional view of a thin film transistor array panel according to another exemplary embodiment of the present invention.

FIG. 27 is a cross-sectional view of a thin film transistor array panel according to the present exemplary embodiment of the present invention.

Gate lines 121 including gate electrodes 124, end portions 129 and storage electrode lines 131 including storage electrodes 133a and 133b are formed on an insulating substrate 110.

A gate insulating layer 140 is formed on the gate lines 121 and the storage electrode lines 131.

Semiconductor stripes 151 made of polysilicon ("poly-Si") doped with an impurity such as phosphorus and include projections 154 are laminated on the gate insulating layer 140.

Semiconductor stripes 151 include polycrystalline semiconductor portions 151a including the projections 154a and impurity-containing portions 151b including the projections 154b. The polycrystalline semiconductor portions 151a and 154a and the impurity-containing portions 151b and 154b have different impurity concentrations from each other. The crystallized portion is indicated by oblique lines in FIG. 27, and the portion containing a great amount of impurity is indicated by dots.

The data lines 171 including the source electrodes 173 and the drain electrodes 175 are formed on the semiconductors 151 and 154, respectively.

A passivation layer 180 having a plurality of contact holes 181, 182, 183a, 183b and 185 is formed on the data lines 171 and the drain electrodes 175 (only 185 shown in FIG. 27). Pixel electrodes 191, overpasses 83 and contact assistants 81 and 82 are formed on the passivation layer 180.

Hereinafter, a method of manufacturing a thin film transistor array panel shown in FIGS. 1 and 27 will be described in more detail with reference to FIGS. 28 to 30.

Figure 28:
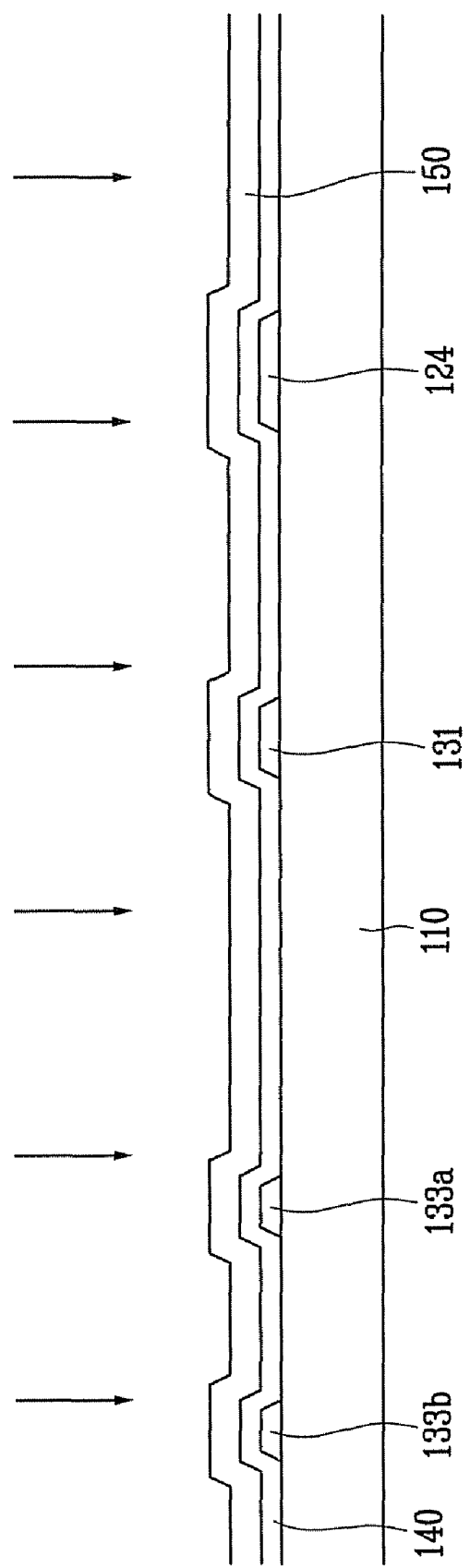
FIGS. 28 to 30 are cross-sectional views showing sequential processes of manufacturing the thin film transistor array panel of FIG. 27.
Figure 29:
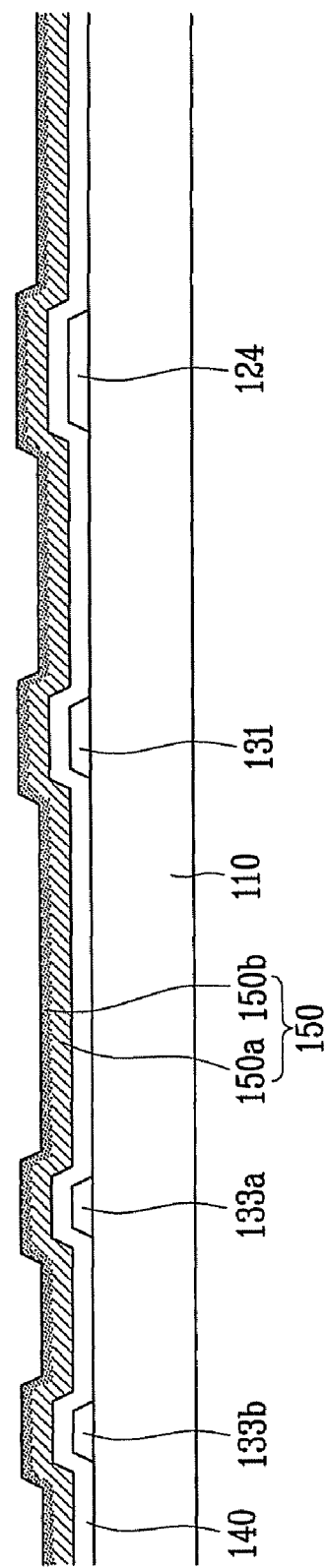

As shown in FIG. 28, the plurality of gate lines 121 including the gate electrodes 124 and the end portions 129, and the plurality of storage electrode lines 131 including the storage electrodes 133a and 133b are formed on the insulating substrate 110. The gate insulating layer 140 and the silicon layer 150 doped with an impurity are then sequentially formed thereon.

Next, the silicon layer 150 doped with an impurity is crystallized by the SPC method. In this case, the crystallization starts to generate a crystalline nucleus at a surface which is in contact with the substrate 110 or the gate lines 121 and grows the crystalline nucleus. Since the impurity concentration of the crystallized silicon layer is much smaller than that of the amorphous silicon layer, a crystallized semiconductor portion 150a located at the substrate 110 or the gate lines 121 has very small amount of an impurity, and the impurity which moves from a lower side due to the crystallization is concentrated on a semiconductor upper portion 150b. Therefore, as shown in FIG. 29, the semiconductor layer 150 includes the crystallized semiconductor portion 150a having a very small amount of an impurity and the semiconductor upper portion 150b having a large amount of the impurity.

Figure 30:
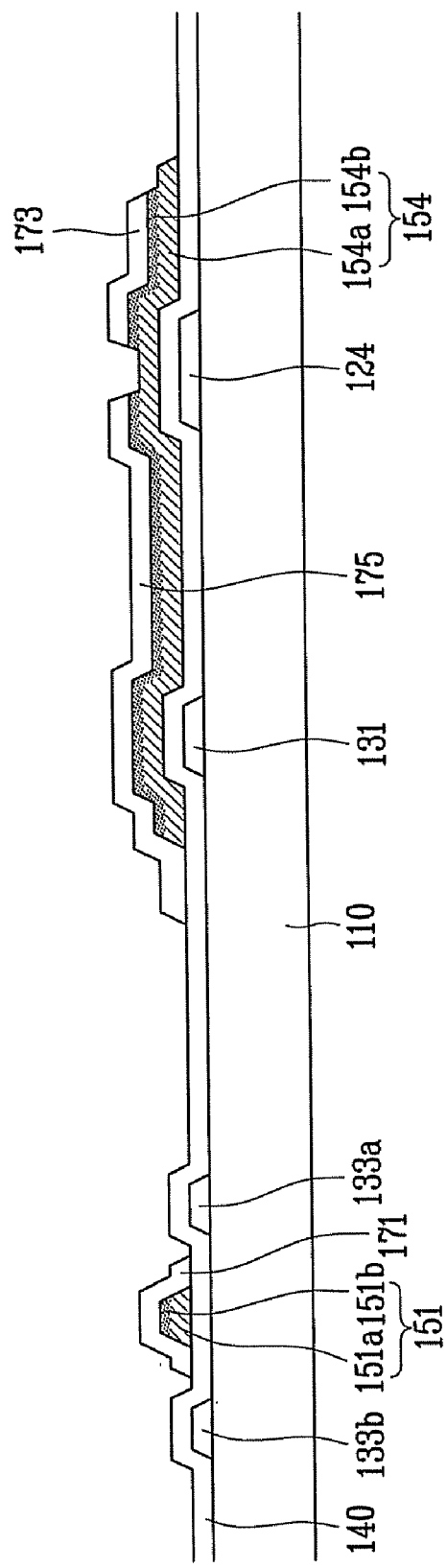

Next, as shown in FIG. 30, the semiconductor stripes 151 including the projections 154 are formed by etching the semiconductor layer 150 through photolithography. The data lines 171 including the source electrodes 173 and the drain electrode 175 are then formed thereon.

Subsequently, the polycrystalline semiconductor portions 151a and 154a are exposed by dry etching the semiconductor portions 151b and 154b containing a large amount of impurity, which are exposed between the data lines 171 and the drain electrodes 175.

Next, as shown in FIG. 27, the passivation layer 180 is formed on the data lines 171 and drain electrodes 175 and etched through photolithography so as to form the plurality of contact holes 181, 182, 183a, 183b and 185 (only 185 shown in FIG. 27), then a conductive material is formed by sputtering thereon and then etched through photolithography, thereby forming the pixel electrodes 191, the contact assistants 81 and 82, and the overpasses 83.

In the present exemplary embodiment, by using the fact that the portion of the semiconductor where crystal grows has a very small amount of impurity, the polycrystalline semiconductor forming a channel is formed in the semiconductor lower portion where a crystalline nucleus grows, and the impurity-containing portion for ohmic contact with source electrodes and the drain electrodes is formed in the upper portion. Therefore, the polycrystalline semiconductor and the impurity semiconductor can be simultaneously embodied in a single layer by using the difference of impurity concentration, which simplifies the process of manufacturing the thin film transistor array panel.

While ensuring high electric field effect mobility by including the polycrystalline semiconductor, the TFT can be formed without an additional mask or an ion doping process by using the bottom gate structure. As a result, the number of processes and cost of manufacturing can be significantly decreased.

While the present invention has been described in connection with what is presently considered to be practical exemplary embodiments, it is to be understood that the present invention is not limited to the disclosed exemplary embodiments, but, on the contrary, is intended to cover various modifications and equivalent arrangements included within the spirit and scope of the appended claims.

What is claimed is:

1. A method of manufacturing a thin film transistor array panel, the method comprising:
   forming gate lines on a substrate;
   forming a gate insulating layer and a first amorphous semiconductor on the gate lines;
   crystallizing the first amorphous semiconductor forming a polycrystalline semiconductor;
   forming an assistant layer on the polycrystalline semiconductor;
   forming data lines including first electrodes and second electrodes on the polycrystalline semiconductor; and
   forming pixel electrodes on the second electrodes,
   wherein the assistant layer has the same plan shape as the polycrystalline semiconductor.

2. The method of claim 1, further comprising forming an ohmic contact after forming the polycrystalline semiconductor.

3. The method of claim 2, further comprising etching the ohmic contact using the data lines and the second electrodes as a mask after forming the data lines and the second electrodes.

4. The method of claim 1, further comprising, after the forming of the first amorphous semiconductor:
   forming an ohmic contact; and
   patterning the first amorphous semiconductor and the ohmic contact.

5. The method of claim 4, wherein, in the crystallizing of the first amorphous semiconductor, the ohmic contact is also crystallized.

6. The method of claim 4, wherein, in the patterning of the first amorphous semiconductor and the ohmic contact, a photosensitive pattern having an uneven thickness is used.

7. The method of claim 1, wherein the assistant layer includes amorphous semiconductor.

8. A method of manufacturing a thin film transistor array panel, comprising:
   forming gate lines on a substrate;
   forming a gate insulating layer and semiconductors containing an impurity on the gate lines;
   forming a first semiconductor layer including a polycrystalline semiconductor and a second semiconductor layer containing an impurity, by performing heat treatment on the semiconductors containing the impurity, wherein the second semiconductor layer is disposed on the first semiconductor layer;
   forming data lines including first electrodes and second electrodes on the second semiconductor layer; and
   forming pixel electrodes on the second electrode.

9. The method of claim 8, wherein the second semiconductor layer contains more impurities than the first semiconductor layer.

* * * * *